United States Patent
Arai et al.

(10) Patent No.: US 11,380,832 B2
(45) Date of Patent: Jul. 5, 2022

(54) THERMOELECTRIC CONVERSION MODULE AND METHOD FOR PRODUCING THERMOELECTRIC CONVERSION MODULE

(71) Applicant: MITSUBISHI MATERIALS CORPORATION, Tokyo (JP)

(72) Inventors: Koya Arai, Saitama (JP); Masahito Komasaki, Saitama (JP); Yoshirou Kuromitsu, Saitama (JP)

(73) Assignee: MITSUBISHI MATERIALS CORPORATION, Tokyo (JP)

( * ) Notice: Subject to any disclaimer, the term of this patent is extended or adjusted under 35 U.S.C. 154(b) by 0 days.

(21) Appl. No.: 16/623,545

(22) PCT Filed: Jun. 29, 2018

(86) PCT No.: PCT/JP2018/024805
§ 371 (c)(1),
(2) Date: Dec. 17, 2019

(87) PCT Pub. No.: WO2019/004429
PCT Pub. Date: Jan. 3, 2019

(65) Prior Publication Data
US 2020/0144472 A1 May 7, 2020

(30) Foreign Application Priority Data

Jun. 29, 2017 (JP) .............................. JP2017-127539
Jun. 26, 2018 (JP) .............................. JP2018-121097

(51) Int. Cl.
*H01L 35/20* (2006.01)
*H01L 35/32* (2006.01)
*H01L 35/34* (2006.01)

(52) U.S. Cl.
CPC .............. *H01L 35/20* (2013.01); *H01L 35/32* (2013.01); *H01L 35/34* (2013.01)

(58) Field of Classification Search
CPC ......... H01L 35/00; H01L 35/02; H01L 35/04; H01L 35/32; H01L 35/34
See application file for complete search history.

(56) References Cited

U.S. PATENT DOCUMENTS

2002/0179135 A1* 12/2002 Shutoh .................... H01L 35/18
136/200
2008/0135082 A1* 6/2008 Hirono ................... H01L 35/08
136/239
(Continued)

FOREIGN PATENT DOCUMENTS

JP  2012-231024 A  11/2012
JP  2012-231025 A  11/2012
(Continued)

OTHER PUBLICATIONS

International Search Report dated Aug. 28, 2018, issued for PCT/JP2018/024805.
(Continued)

*Primary Examiner* — Mayla Gonzalez Ramos
(74) *Attorney, Agent, or Firm* — Locke Lord LLP; James E. Armstrong, IV; Nicholas J. DiCeglie, Jr.

(57) ABSTRACT

A thermoelectric conversion module is a thermoelectric conversion module in which a plurality of thermoelectric conversion elements are electrically connected to each other via a first electrode portion disposed on first end side of the thermoelectric conversion elements and a second electrode portion disposed on the second end side of the thermoelectric conversion elements; a first insulating circuit board provided with a first insulating layer of which at least one surface is made of alumina and the first electrode portion formed of a sintered body of Ag formed on the one surface
(Continued)

of the first insulating layer is disposed on the first end side of the thermoelectric conversion elements; and a glass component is present at an interface between the first electrode portion and the first insulating layer.

7 Claims, 4 Drawing Sheets

(56) References Cited

U.S. PATENT DOCUMENTS

2017/0125658 A1* 5/2017 Funahashi ................. C22C 5/06
2019/0058101 A1* 2/2019 Oi ........................... H01L 35/34

FOREIGN PATENT DOCUMENTS

| | | | |
|---|---|---|---|
| JP | 2013-197265 A | 9/2013 | |
| JP | 2015-122464 A | 7/2015 | |
| JP | 2017-059823 A | 3/2017 | |
| JP | 2017059823 A * | 3/2017 | ............. H01L 35/08 |
| TW | 201133965 A | 10/2011 | |
| TW | 201622189 A | 6/2016 | |
| WO | 2014/073095 A1 | 5/2014 | |
| WO | 2015/174462 A1 | 11/2015 | |
| WO | 2017/059256 A1 | 4/2017 | |

OTHER PUBLICATIONS

Office Action issued in corresponding Taiwanese Patent Application No. TW 107122510, dated Jan. 4, 2022.

* cited by examiner

THERMOELECTRIC CONVERSION MODULE AND METHOD FOR PRODUCING THERMOELECTRIC CONVERSION MODULE

TECHNICAL FIELD

This invention relates to a thermoelectric conversion module in which a plurality of thermoelectric conversion elements are electrically connected to each other, and a method for producing a thermoelectric conversion module.

Priority is claimed on Japanese Patent Application No. 2017-127539, filed on Jun. 29, 2017, and Japanese Patent Application No. 2018-121097, filed on Jun. 26, 2018, the contents of which are incorporated herein by reference.

BACKGROUND ART

A thermoelectric conversion element is an electronic element that enables conversion between thermal energy and electric energy by the Seebeck effect or the Peltier effect. The Seebeck effect is a phenomenon in which an electromotive force is generated when a temperature difference is generated between both ends of a thermoelectric conversion element, and thermal energy is converted into electric energy. The electromotive force generated by the Seebeck effect is determined by the characteristics of the thermoelectric conversion element. In recent years, thermoelectric power generation utilizing this effect has been actively developed.

The Peltier effect is a phenomenon in which a temperature difference is generated at both ends of a thermoelectric conversion element when an electrode or the like is formed at both ends of the thermoelectric conversion element and a potential difference is generated between the electrodes, and electric energy is converted into thermal energy. An element having this effect is particularly called a Peltier element, and is used for cooling and temperature control of precision instruments and small refrigerators.

As a thermoelectric conversion module using the above-described thermoelectric conversion element, for example, a structure in which n-type thermoelectric conversion elements and p-type thermoelectric conversion elements are alternately connected in series has been proposed.

Such a thermoelectric conversion module has a structure in which a heat transfer plate is disposed on each of a first end side and a second end side of a plurality of thermoelectric conversion elements, and the thermoelectric conversion elements are connected in series by electrode portions disposed in the heat transfer plates. As the above-described heat transfer plate, an insulating circuit board provided with an insulating layer and the electrode portion may be used.

In addition, electric energy is generated by the Seebeck effect by generating a temperature difference between the heat transfer plate disposed on first end side of the thermoelectric conversion element and the heat transfer plate disposed on the second end side of the thermoelectric conversion element. Alternatively, by passing a current through the thermoelectric conversion element, a temperature difference can be generated between the heat transfer plate disposed on the first end side of the thermoelectric conversion element and the heat transfer plate disposed on the second end side of the thermoelectric conversion element by the Peltier effect.

Here, in the thermoelectric conversion module described above, in order to improve the thermoelectric conversion efficiency, it is necessary to keep the electric resistance in the electrode portion connected to the thermoelectric conversion element low.

For this reason, in the related art, a Ag paste or the like particularly excellent in conductivity is used to bond a thermoelectric conversion element to an electrode portion. Furthermore, the electrode portion itself may be formed of a Ag paste and bonded to the thermoelectric conversion element.

However, a sintered body of the Ag paste has a relatively large number of pores, and the electric resistance cannot be kept sufficiently low. In addition, when a thermoelectric conversion module is used in a medium temperature range of 350° C. or higher, sintering progresses gradually in the sintered body of the Ag paste, the structure of the sintered body changes, and there is concern that the thermoelectric conversion element may be altered due to the gas present in the pores.

In order to reduce the pores by densifying the sintered body of the Ag paste, liquid phase sintering achieved by performing heating to the melting point of silver (960° C.) or higher is considered. However, under such high temperature conditions, there is concern that the thermoelectric conversion element may be deteriorated by heat at the time of bonding.

Therefore, for example, Patent Document 1 proposes a method of bonding a thermoelectric conversion element by forming an electrode portion using a silver braze having a melting point lower than that of silver.

In addition, Patent Document 2 proposes a method of forming a dense film by applying a glass solution to the entire outer peripheral surface of a bonding layer and drying the glass solution in air in order to suppress deterioration of a thermoelectric conversion element due to gas in pores.

CITATION LIST

Patent Literature

[Patent Document 1] Japanese Unexamined Patent Application, First Publication No. 2013-197265
[Patent Document 2] Japanese Unexamined Patent Application, First Publication No. 2012-231025

DISCLOSURE OF INVENTION

Technical Problem

Here, in the method described in Patent Document 1, although the silver braze having a melting point lower than that of silver is used, it is preferable that the melting point of the silver braze used is, for example, 750° C. to 800° C. so that the silver braze does not melt even at an operating temperature of the thermoelectric conversion module (refer to paragraph 0023 of Patent Document 1). In a case where the thermoelectric conversion element is bonded under such a relatively high temperature condition, there is concern that the characteristics of the thermoelectric conversion elements may be deteriorated due to heat at the time of bonding.

In addition, in the method described in Patent Document 2, although bonding is performed at 500° C. to 800° C. using a silver paste, in this case, there is concern that the thermoelectric conversion element may be deteriorated due to heat at the time of bonding.

This invention has been made in view of the above-described circumstances, and an object thereof is to provide a thermoelectric conversion module in which the electric resistance in an electrode portion is low, deterioration of a thermoelectric conversion element at the time of bonding is suppressed, and excellent thermoelectric conversion efficiency is achieved, and a method for producing a thermoelectric conversion module.

Solution to Problem

In order to solve the problems, a thermoelectric conversion module of the present invention is a thermoelectric conversion module including: a plurality of thermoelectric conversion elements; a first electrode portion disposed on a first end side of the thermoelectric conversion elements; and a second electrode portion disposed on a second end side of the thermoelectric conversion elements, in which the plurality of thermoelectric conversion elements are electrically connected to each other via the first electrode portion and the second electrode portion, a first insulating circuit board provided with a first insulating layer of which at least one surface is made of alumina and the first electrode portion formed of a sintered body of Ag formed on the one surface of the first insulating layer is disposed on the first end side of the thermoelectric conversion elements, a glass component is present at an interface between the first electrode portion and the first insulating layer, and the first electrode portion has a thickness of 30 μm or more and a porosity of less than 10% at least in a region where the thermoelectric conversion element is disposed.

According to the thermoelectric conversion module of the present invention, the first insulating circuit board provided with the first insulating layer of which at least one surface is made of alumina and the first electrode portion formed of the sintered body of Ag formed on the one surface of the first insulating layer is disposed on the first end side of the thermoelectric conversion elements, and the first electrode portion has a thickness of 30 μm or more and a porosity P of less than 10% at least in the region where the thermoelectric conversion element is disposed. Therefore, the first electrode portion is formed dense and thick, and the electric resistance can be reduced. Moreover, since there are few pores, deterioration of the thermoelectric conversion element due to the gas of the pores can be suppressed.

Furthermore, since the first electrode portion is formed of the sintered body of the Ag paste, a bonding temperature (sintering temperature) can be under a relatively low temperature condition, and deterioration of the thermoelectric conversion element at the time of bonding can be suppressed. In addition, since the first electrode portion itself is made of Ag, the first electrode portion can be stably operated even at an operating temperature of about 500° C. to 800° C.

Furthermore, since the surface (one surface) of the first insulating layer on which the first electrode portion is formed is made of alumina and the glass component is present at the interface between the first electrode portion and the first insulating layer, the first electrode portion and the first insulating layer are firmly bonded to each other by the reaction between the glass component and alumina, and the bonding reliability is excellent.

Here, in the thermoelectric conversion module of the present invention, it is preferable that the first electrode portion includes a glass-containing region and a glass-free region from the first insulating layer side in a lamination direction, and when a thickness of the glass-containing region in the lamination direction is referred to as Tg and a thickness of the glass-free region in the lamination direction is referred to as Ta, Ta/(Ta+Tg) is more than 0 and not more than 0.5.

In this case, since the first electrode portion has a structure in which the glass-containing region and the glass-free region are laminated and when the thickness of the glass-containing region in the lamination direction is referred to as Tg and the thickness of the glass-free region in the lamination direction is referred to as Ta, Ta/(Ta+Tg) is limited to 0.5 or less, it is possible to suppress the occurrence of delamination at the interface between the glass-containing region and the glass-free region. In addition, since Ta/(Ta+Tg) exceeds 0, no glass component is present on the bonding surface to the thermoelectric conversion element, and it is possible to improve the bonding between the thermoelectric conversion element and the first electrode portion.

In addition, the thermoelectric conversion module of the present invention may have a configuration in which a second insulating circuit board provided with a second insulating layer of which at least one surface is made of alumina and the second electrode portion formed of a sintered body of Ag formed on the one surface of the second insulating layer is disposed on the second end side of the thermoelectric conversion elements, a glass component is present at an interface between the second electrode portion and the second insulating layer, and the second electrode portion has a thickness of 30 μm or more and a porosity of less than 10% at least in a region where the thermoelectric conversion element is disposed.

In this case, since the second insulating circuit board provided with the second insulating layer of which at least one surface is made of alumina and the second electrode portion formed of the sintered body of Ag formed on the one surface of the second insulating layer is disposed on the second end side of the thermoelectric conversion elements and the second electrode portion of the second insulating circuit board also has a thickness of 30 μm or more and a porosity P of less than 10% at least in the region where the thermoelectric conversion element is disposed, the second electrode portion is formed dense and thick, and the electric resistance decreases. Moreover, since there are few pores, deterioration of the thermoelectric conversion element due to the gas of the pores can be suppressed.

Furthermore, since the second electrode portion is formed of the sintered body of the Ag paste, a bonding temperature (sintering temperature) can be under a relatively low temperature condition, and deterioration of the thermoelectric conversion element at the time of bonding can be suppressed. In addition, since the second electrode portion itself is made of Ag, the second electrode portion can be stably operated even at an operating temperature of about 500° C. to 800° C.

Furthermore, since the surface (one surface) of the second insulating layer on which the second electrode portion is formed is made of alumina and the glass component is present at the interface between the second electrode portion and the second insulating layer, the second electrode portion and the second insulating layer are firmly bonded to each other by the reaction between the glass component and alumina, and the bonding reliability is excellent.

Here, in the thermoelectric conversion module of the present invention, it is preferable that the second electrode portion includes a glass-containing region and a glass-free region from the second insulating layer side in the lamination direction, and when a thickness of the glass-containing region in the lamination direction is referred to as Tg and a thickness of the glass-free region in the lamination direction is referred to as Ta, Ta/(Ta+Tg) is more than 0 and not more than 0.5.

In this case, since the second electrode portion has a structure in which the glass-containing region and the glass-free region are laminated and when the thickness of the glass-containing region in the lamination direction is referred to as Tg and the thickness of the glass-free region in the lamination direction is referred to as Ta, Ta/(Ta+Tg) is limited to 0.5 or less, it is possible to suppress the occurrence of delamination at the interface between the glass-containing region and the glass-free region. In addition, since Ta/(Ta+Tg) exceeds 0, no glass component is present on the bonding surface to the thermoelectric conversion element, and it is possible to improve the bonding between the thermoelectric conversion element and the second electrode portion.

A method for producing a thermoelectric conversion module of the present invention is a method for producing a thermoelectric conversion module. The thermoelectric conversion module includes a plurality of thermoelectric conversion elements, a first electrode portion disposed on a first end side of the thermoelectric conversion elements, and a second electrode portion disposed on a second end side of the thermoelectric conversion elements, wherein the plurality of thermoelectric conversion elements are electrically connected to each other via the first electrode portion and the second electrode portion. In the thermoelectric conversion module, a first insulating circuit board provided with a first insulating layer of which at least one surface is made of alumina and the first electrode portion formed of a sintered body of Ag formed on the one surface of the first insulating layer is disposed on the first end side of the thermoelectric conversion elements. The method includes: a Ag paste applying step of applying a Ag paste containing Ag to the one surface of the first insulating layer to a thickness of 30 μm or more; a sintering step of forming the first electrode portion by sintering the Ag paste; a laminating step of laminating the first insulating layer on the first end side of the thermoelectric conversion elements via the first electrode portion; and a thermoelectric conversion element bonding step of bonding the thermoelectric conversion elements by pressurizing and heating the thermoelectric conversion elements and the first insulating layer in a lamination direction, wherein, in the Ag paste applying step, a glass-containing Ag paste is applied to at least a lowermost layer in contact with the first insulating layer; in the thermoelectric conversion element bonding step, a pressurization load is in a range of 20 MPa or more and 50 MPa or less and a heating temperature is 300° C. or higher; and the first electrode portion has a thickness of 30 μm or more and a porosity of less than 10% at least in a region where the thermoelectric conversion element is disposed.

According to the method for producing the thermoelectric conversion module configured as described above, in the thermoelectric conversion element bonding step, since the pressurization load is in a range of 20 MPa or more and 50 MPa or less and the heating temperature is 300° C. or higher, the thickness can be 30 μm or more and the porosity can be less than 10% at least in the region of the first electrode portion where the thermoelectric conversion element is disposed. Moreover, since a relatively low temperature condition is applied, deterioration of the thermoelectric conversion element at the time of bonding (at the time of sintering) can be suppressed.

In addition, in the Ag paste applying step, since the glass-containing Ag paste is applied to at least the lowermost layer in contact with the first insulating layer, the first insulating layer and the first electrode portion can be reliably bonded to each other by the reaction between the glass component of the glass-containing Ag paste and alumina.

Here, in the method for producing a thermoelectric conversion module of the present invention, a configuration in which in the Ag paste applying step, a Ag paste which does not contain a glass component is applied to an uppermost layer of the first electrode portion in contact with the thermoelectric conversion element may be adopted.

In this case, since the Ag paste which does not contain a glass component is applied to the uppermost layer in contact with the thermoelectric conversion element, the glass-free region which does not contain a glass component can be reliably formed on the thermoelectric conversion element side of the first electrode portion, and it is possible to improve the bonding between the first electrode portion and the thermoelectric conversion element.

In addition, in the method for producing a thermoelectric conversion module of the present invention, a configuration in which in the laminating step, the thermoelectric conversion element is disposed after disposing a Ag bonding material on the first electrode portion may be adopted.

In this case, since the thermoelectric conversion element is disposed after disposing the Ag bonding material on the first electrode portion and thereafter the thermoelectric conversion element is bonded under the above-described conditions, the Ag bonding material applied onto the first electrode portion can also be densified, and the porosity can be less than 10%. In addition, it is possible to improve the bonding between the first electrode portion and the thermoelectric conversion element.

In addition, in the method for producing a thermoelectric conversion module of the present invention, a configuration in which in the thermoelectric conversion module, the first insulating circuit board provided with the first insulating layer of which at least one surface is made of alumina and the first electrode portion formed of the sintered body of Ag formed on the one surface of the first insulating layer is disposed on the first end side of the thermoelectric conversion elements, and a second insulating circuit board provided with a second insulating layer of which at least one surface is made of alumina and the second electrode portion formed of a sintered body of Ag formed on the one surface of the second insulating layer is disposed on the second end side of the thermoelectric conversion elements, in the Ag paste applying step, the Ag paste containing silver is applied to the one surfaces of the first insulating layer and the second insulating layer to a thickness of 30 μm or more, and a glass-containing Ag paste is applied to at least lowermost layers in contact with the first insulating layer and the second insulating layer, in the sintering step, the first electrode portion and the second electrode portion are formed by sintering the Ag paste, in the laminating step, the first insulating layer is laminated on the first end side of the thermoelectric conversion elements via the first electrode portion, and the second insulating layer is laminated on the second end side of the thermoelectric conversion elements via the second electrode portion, in the thermoelectric conversion element bonding step, the first electrode portion and the thermoelectric conversion element, and the thermoelectric conversion element and the second electrode portion are bonded by pressurizing and heating the first insulating layer, the thermoelectric conversion element, and the second insulating layer in the lamination direction, and in the thermoelectric conversion element bonding step, the pressurization load is in a range of 20 MPa or more and 50 MPa or less, the heating temperature is 300° C. or higher, and the first electrode portion and the second electrode portion have a thickness of 30 μm or more and a porosity of less than 10% at least in regions where the thermoelectric conversion element is disposed may be adopted.

In this case, also in the second electrode portion of the second insulating circuit board disposed on the second end side of the thermoelectric conversion elements, the thickness can be 30 μm or more and the porosity can be less than 10% at least in the region where the thermoelectric conversion element is disposed. Moreover, since a relatively low temperature condition is applied, deterioration of the thermoelectric conversion element at the time of bonding (at the time of sintering) can be suppressed.

In addition, in the Ag paste applying step, since the glass-containing Ag paste is applied to at least the lowermost layers in contact with the first insulating layer and the second insulating layer, the first insulating layer and the first electrode portion, and the second insulating layer and the second electrode portion can be reliably bonded to each other by the reaction between the glass component of the glass-containing Ag paste and alumina.

Furthermore, in the method for producing a thermoelectric conversion module of the present invention, a configuration in which in the Ag paste applying step, a Ag paste which does not contain the glass component is applied to an uppermost layer of the second electrode portion in contact with the thermoelectric conversion element may be adopted.

In addition, since the Ag paste which does not contain a glass component is applied to the uppermost layer of the second electrode portion in contact with the thermoelectric conversion element, the glass-free region which does not contain a glass component can be reliably formed on the thermoelectric conversion element side of the second electrode portion, and it is possible to improve the bonding between the first electrode portion and the thermoelectric conversion element.

In addition, in the method for producing a thermoelectric conversion module of the present invention, a configuration in which the thermoelectric conversion element is disposed after disposing a Ag bonding material on the second electrode portion may be adopted.

In this case, since the thermoelectric conversion element is disposed after disposing the Ag bonding material on the second electrode portion and thereafter the thermoelectric conversion element is bonded under the above-described conditions, the Ag bonding material applied onto the second electrode portion can also be densified, and the porosity can be less than 10%. In addition, it is possible to improve the bonding between the second electrode portion and the thermoelectric conversion element.

Advantageous Effects of Invention

According to the present invention, it is possible to provide a thermoelectric conversion module in which the electric resistance in an electrode portion is low, deterioration of a thermoelectric conversion element at the time of bonding is suppressed, and excellent thermoelectric conversion efficiency is achieved, and a method for producing a thermoelectric conversion module.

BEST MODE FOR CARRYING OUT THE INVENTION

Figure 1:
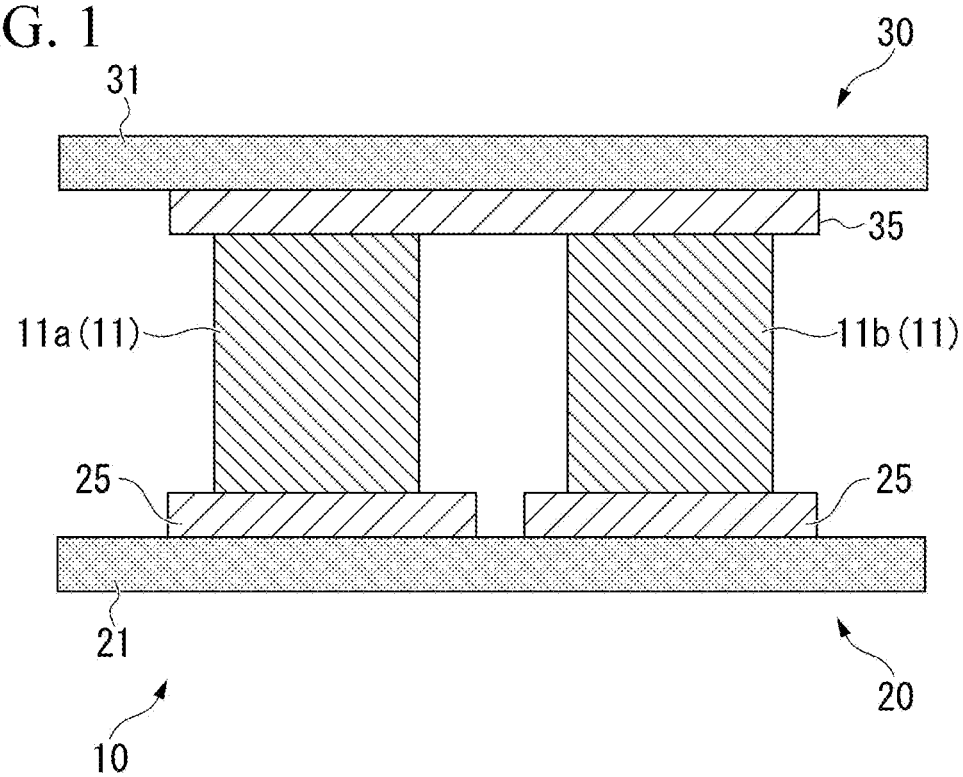
FIG. 1 is a schematic explanatory view of a thermoelectric conversion module according to an embodiment of the present invention.

Hereinafter, embodiments of the present invention will be described with reference to the accompanying drawings. In addition, each of the embodiments described below is specifically described for better understanding of the spirit of the invention, and does not limit the present invention unless otherwise specified. In addition, in the drawings used in the following description, in order to facilitate the understanding of the features of the present invention, there is a case where a part which becomes a main part is shown in an enlarged manner for convenience, and the dimensional ratio of each component is not necessarily the same as the reality.

As shown in FIG. 1, a thermoelectric conversion module 10 according to the present embodiment includes a plurality of columnar thermoelectric conversion elements 11, a first heat transfer plate 20 disposed on a first end side (lower side in FIG. 1) of the thermoelectric conversion elements 11 in a longitudinal direction thereof, and a second heat transfer plate 30 disposed on a second end side (upper side in FIG. 1) of the thermoelectric conversion elements 11 in the longitudinal direction.

Here, as shown in FIG. 1, a first electrode portion 25 is formed in the first heat transfer plate 20 provided on the first end side of the thermoelectric conversion elements 11, a second electrode portion 35 is formed in the second heat transfer plate 30 provided on the second end side of the thermoelectric conversion elements 11, and the plurality of columnar thermoelectric conversion elements 11 are electrically connected in series by the first electrode portion 25 and the second electrode portion 35.

The first heat transfer plate 20 is formed as a first insulating circuit board provided with a first insulating layer 21 and the first electrode portion 25 formed on one surface (the upper surface in FIG. 1) of the first insulating layer 21.

Here, in the first insulating layer 21 of the first heat transfer plate 20 (the first insulating circuit board), at least a surface (one surface) on which the first electrode portion 25 is formed is made of alumina. In the present embodiment, the entire first insulating layer 21 is made of alumina.

In the first insulating layer 21, an interface with a silver paste may be made of alumina. Therefore, for example, a substrate in which aluminum nitride is oxidized and the surface is made of alumina may be used as the first insulating layer 21. The thickness of the alumina may be in a range of 1 μm or more and 2000 μm or less.

In addition, the thickness of the first insulating layer 21 may be in a range of 100 μm or more and 2000 μm or less.

The first electrode portion 25 is formed of a sintered body of Ag, and the lowermost layer thereof in contact with at least the one surface of the first insulating layer 21 made of alumina is formed of a sintered body of a glass-containing Ag paste containing a glass component. In the present embodiment, the entire first electrode portion 25 is formed of the sintered body of the glass-containing Ag paste. The first electrode portion 25 is formed in a pattern on the one surface (the upper surface in FIG. 1) of the first insulating layer 21.

In addition, the first electrode portion 25 has a thickness of 30 μm or more and a porosity P of less than 10% at least in a region where the thermoelectric conversion element 11 is disposed.

The upper limit of the thickness of at least the region where the thermoelectric conversion element 11 is disposed in the first electrode portion 25 is preferably 70 μm. The porosity P can be reduced to 0%.

The porosity P of the first electrode portion 25 can be calculated as follows. After mechanically polishing a cross section of the first electrode portion 25, Ar ion etching (Cross Section Polisher SM-09010 manufactured by JEOL Ltd.) was performed thereon, and the cross section was observed using a laser microscope (VK X-200 manufactured by Keyence Corporation). The obtained image was binarized, white portions were determined as Ag, and black portions were determined as pores. From the binarized image, the area of the black portions was obtained, and the porosity was calculated by the following formula. Measurement was performed at five cross sections, and the porosities of the cross sections were arithmetically averaged to obtain the porosity of the first electrode portion 25.

Porosity $P$=area of black portions (pores)/observation area of the first electrode portion 25

Here, as described above, since the lowermost layer of the first electrode portion 25 in contact with at least the one surface of the first insulating layer 21 made of alumina is formed of the sintered body of the glass-containing Ag paste containing the glass component, the glass component is present at the interface between the first insulating layer 21 and the first electrode portion 25.

In the present embodiment, the entire first electrode portion 25 is formed of the sintered body of the glass-containing Ag paste, and glass particles are dispersed inside the first electrode portion 25. The glass particles are present at the interface between the first insulating layer 21 (alumina) and the first electrode portion 25. A portion of the glass component enters the first insulating layer 21 (alumina) side.

Figure 2:
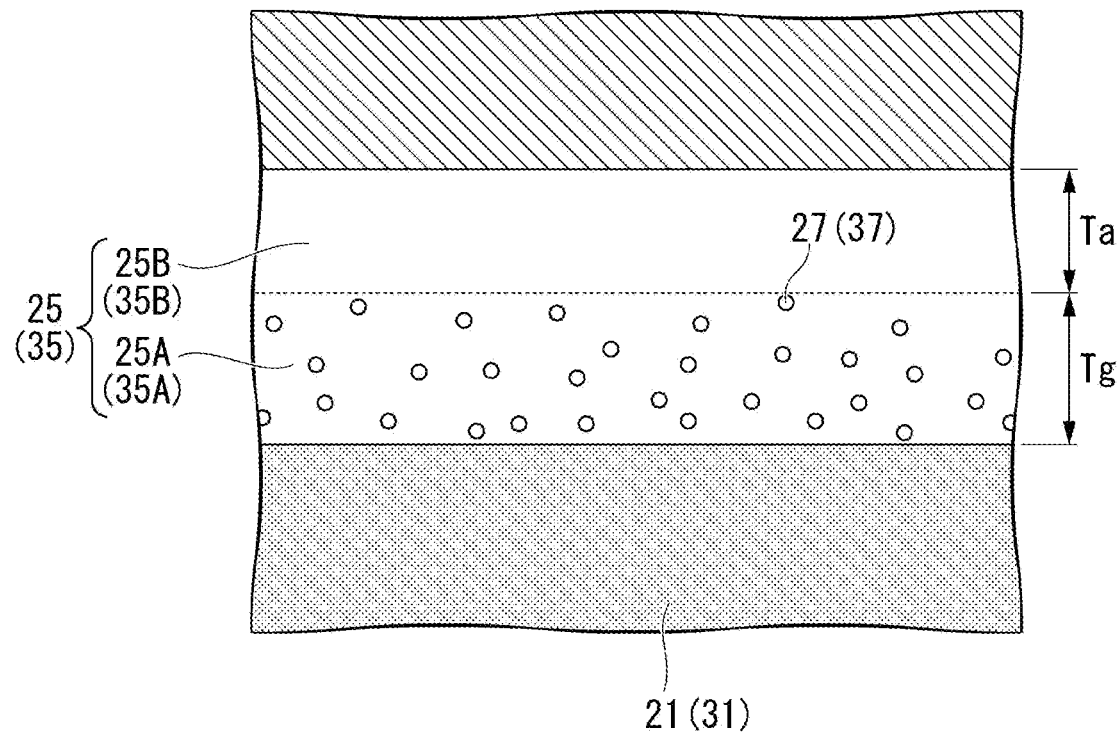
FIG. 2 is a schematic explanatory view showing a glass-containing region and a glass-free region in a first electrode portion and a second electrode portion.

In the present embodiment, as shown in FIG. 2, the first electrode portion 25 includes a glass-containing region 25A containing the glass component and a glass-free region 25B that does not contain a glass component from the first insulating layer 21 side in a lamination direction. When the thickness of the glass-containing region 25A in the lamination direction is referred to as Tg and the thickness of the glass-free region 25B in the lamination direction is referred to as Ta, Ta/(Ta+Tg) is preferably more than 0 and not more than 0.5. Ta/(Ta+Tg) is more preferably in a range of 0.17 or more and 0.83 or less, and even more preferably in a range of 0.33 or more and 0.67 or less.

As shown in FIG. 2, the thickness Tg of the glass-containing region 25A in the lamination direction is set to a thickness up to a glass particle 27 that is farthest from the first insulating layer 21 in the lamination direction.

The thickness Ta of the glass-free region 25B in the lamination direction is set to a value obtained by subtracting the thickness Tg of the glass-containing region 25A in the lamination direction from the thickness of the first electrode portion 25.

The second heat transfer plate 30 is formed as a second insulating circuit board provided with a second insulating layer 31 and the second electrode portion 35 formed on one surface (the lower surface in FIG. 1) of the second insulating layer 31.

Here, the second insulating layer 31 of the second heat transfer plate 30 (the second insulating circuit board) can have the same configuration as the first insulating layer 21 described above.

The second electrode portion 35 is formed of a sintered body of Ag, and the lowermost layer thereof in contact with at least the one surface of the second insulating layer 31 made of alumina is formed of a sintered body of a glass-containing Ag paste containing a glass component. In the present embodiment, the entire second electrode portion 35 is formed of the sintered body of the glass-containing Ag paste. The second electrode portion 35 is formed in a pattern on the one surface (the upper surface in FIG. 1) of the second insulating layer 31.

In addition, the second electrode portion 35 has a thickness of 30 μm or more and a porosity P of less than 10% at least in a region where the thermoelectric conversion element 11 is disposed.

The upper limit of the thickness of at least the region where the thermoelectric conversion element 11 is disposed in the second electrode portion 35 is preferably 70 μm. The porosity P can be reduced to 0%.

The porosity P of the second electrode portion 35 can be calculated by the same method as that for the first electrode portion 25.

Here, as described above, since the lowermost layer of the second electrode portion 35 in contact with at least the one surface of the second insulating layer 31 made of alumina is formed of the sintered body of the glass-containing Ag paste containing the glass component, the glass component is present at the interface between the second insulating layer 31 and the second electrode portion 35.

In the present embodiment, the entire second electrode portion 35 is formed of the sintered body of the glass-containing Ag paste, and glass particles are dispersed inside the second electrode portion 35. The glass particles are present at the interface between the second insulating layer 31 (alumina) and the second electrode portion 35. A portion of the glass component enters the second insulating layer 31 (alumina) side.

In the present embodiment, as shown in FIG. 2, the second electrode portion 35 includes a glass-containing region 35A having the glass component and a glass-free region 35B that does not have a glass component from the second insulating layer 31 side in a lamination direction. When the thickness of the glass-containing region 35A in the lamination direction is referred to as Tg and the thickness of the glass-free region 35B in the lamination direction is referred to as Ta, Ta/(Ta+Tg) is preferably more than 0 and not more than 0.5. Ta/(Ta+Tg) is more preferably in a range of 0.17 or more and 0.83 or less, and even more preferably in a range of 0.33 or more and 0.67 or less.

As shown in FIG. 2, the thickness Tg of the glass-containing region 35A in the lamination direction is set to a thickness up to a glass particle 37 that is farthest from the second insulating layer 31 in the lamination direction.

The thickness Ta of the glass-free region 35B in the lamination direction is set to a value obtained by subtracting the thickness Tg of the glass-containing region 35A in the lamination direction from the thickness of the second electrode portion 35.

The thermoelectric conversion elements 11 include n-type thermoelectric conversion elements 11a and p-type thermoelectric conversion elements 11b, and the n-type thermoelectric conversion elements 11a and the p-type thermoelectric conversion elements 11b are alternately arranged.

In addition, metallized layers (not shown) are respectively formed on one end surface and the other end surface of the thermoelectric conversion element 11. As the metallized layer, for example, nickel, silver, cobalt, tungsten, molybdenum, or a nonwoven fabric made of fibers of such metals can be used. In addition, it is preferable that the outermost surface of the metallized layer (bonding surface to the first electrode portion 25 and the second electrode portion 35) is made of Au or Ag.

For example, the n-type thermoelectric conversion element 11a and the p-type thermoelectric conversion element 11b are formed of sintered bodies of tellurium compounds, skutterudites, filled skutterudites, Heuslers, half-Heuslers, clathrates, silicides, oxides, or silicon-germanium.

As a material of the n-type thermoelectric conversion element 11a, for example, $Bi_2Te_3$, PbTe, $La_3Te_4$, $CoSb_3$, FeVAl, ZrNiSn, $BasAl_{16}Si_{30}$, $Mg_2Si$, $FeSi_2$, $SrTiO_3$, $CaMnO_3$, ZnO, or SiGe is used.

In addition, as a material of the p-type thermoelectric conversion element 11b, for example, $Bi_2Te_3$, $Sb_2Te_3$, PbTe, TAGS (=Ag—Sb—Ge—Te), $Zn_4Sb_3$, $CoSb_3$, $CeFe_4Sb_{12}$, $Yb_{14}MnSb_{11}$, FeVAl, $MnSi_{1.73}$, $FeSi_2$, $NaxCoO_2$, $Ca_3Co_4O_7$, $Bi_2Sr_2Co_2O_7$, or SiGe is used.

There are compounds that can take both n-type and p-type depending on the dopant, and compounds that have either n-type or p-type properties.

Figure 3:
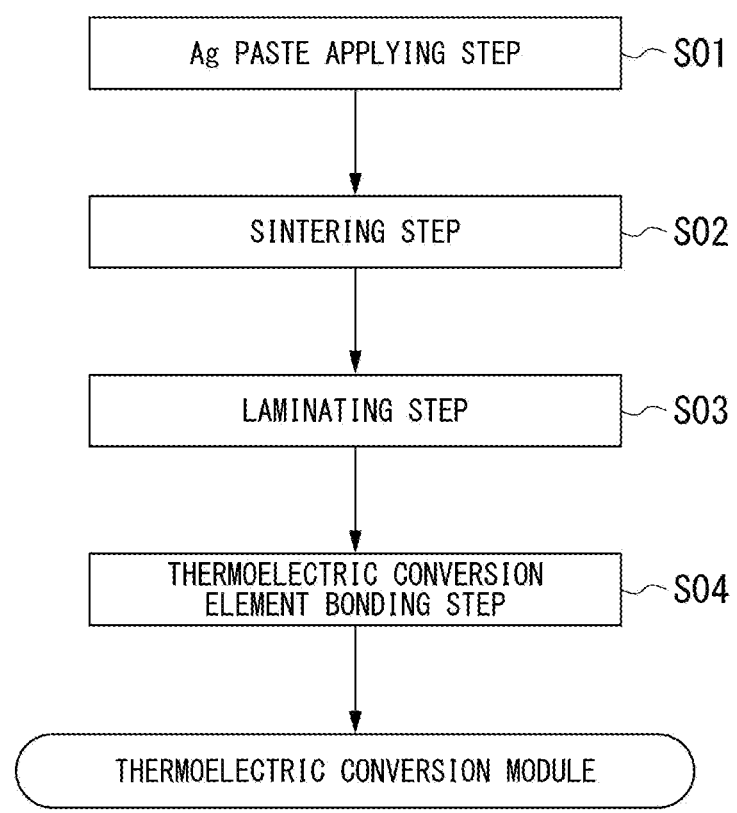
FIG. 3 is a flowchart showing a method for producing a thermoelectric conversion module according to the embodiment of the present invention.

Next, a method for producing the thermoelectric conversion module 10, which is the present embodiment described above, will be described with reference to FIGS. 3 and 4.

(Ag Paste Applying Step S01)

First, a Ag paste containing Ag is applied to each of the one surface of the first insulating layer 21 and the one surface of the second insulating layer 31 to a thickness exceeding 30 μm. The application thickness is preferably 40 μm or more. Here, the application method is not particularly limited, and various means such as a screen-printing method, an offset printing method, and a photosensitive process can be adopted. At this time, the glass-containing Ag paste having the glass component is applied to the lowermost layers in contact with the first insulating layer 21 and the second insulating layer 31.

Here, in order to cause the application thickness to exceed 30 μm, paste application and drying may be repeated. In this case, a glass-containing paste may be applied to the lowermost layers in contact with the first insulating layer 21 and the second insulating layer 31, and thereafter a Ag paste that does not contain the glass component may be applied.

Alternatively, a Ag paste that does not contain the glass component may be applied to the uppermost layer in contact with the thermoelectric conversion element 11.

Furthermore, a first glass-containing paste may be applied to the lowermost layers in contact with the first insulating layer 21 and the second insulating layer 31, a second glass-containing paste having a lower glass content than that of the first glass-containing paste may be applied onto the first glass-containing paste, and a Ag paste that does not contain the glass component may be applied onto the second glass-containing paste.

In addition, when the pastes are applied a plurality of times, it is preferable to apply the next paste after drying the applied paste. Furthermore, after sintering the applied paste once, the next paste may be applied.

Here, in a case where the Ag paste that does not contain the glass component is applied to the uppermost layer in contact with the thermoelectric conversion element 11, it is preferable that the thickness of the glass-free regions 25B and 35B is controlled by adjusting the thickness of the Ag paste applied such that Ta/(Ta+Tg) mentioned above is in a range of more than 0 and not more than 0.5.

In the present embodiment, as shown in FIG. 4(a), glass-containing Ag pastes 45 and 55 are respectively applied to the one surface of the first insulating layer 21 and the one surface of the second insulating layer 31 to a thickness exceeding 30 μm.

Here, the glass-containing Ag paste forming the first electrode portion 25 and the second electrode portion 35 in the present embodiment will be described.

As the glass-containing Ag paste, a paste primarily containing silver as a conductive metal and containing glass frit for bonding to a ceramic substrate can be used. For example, a paste for LTCC manufactured by Daiken Chemical Co., Ltd., or a glass-containing Ag paste such as TDPAG-TS1002 manufactured by AS ONE Corporation or DD-1240D manufactured by Kyoto Elex Co., Ltd. can be used. In the present embodiment, DD-1240D manufactured by Kyoto Elex Co., Ltd. was used.

(Sintering Step S02)

Next, a heating treatment is performed in a state where the Ag pastes (the glass-containing Ag pastes 45 and 55) are respectively applied to the one surface of the first insulating layer 21 and the one surface of the second insulating layer 31 such that the Ag pastes (the glass-containing Ag pastes 45 and 55) are sintered. Before the sintering, a drying treatment for removing the solvent of the Ag pastes (the glass-containing Ag pastes 45 and 55) may be performed. Accordingly, the first electrode portion 25 and the second electrode portion 35 shown in FIG. 4(b) are formed.

In the sintering step S02, sintering is preferably performed under conditions of an air atmosphere, a heating temperature of 800° C. or higher and 900° C. or lower, and a holding time of 10 minutes or longer and 60 minutes or shorter at the heating temperature.

Annealing may be performed after the sintering step S02. By performing the annealing, the first electrode portion 25 and the second electrode portion 35 can be made into denser sintered bodies. The annealing condition may be a condition with 700° C. to 850° C. and 1 to 24 hours.

(Laminating Step S03)

Next, the first insulating layer 21 is disposed on the first end side (lower side in FIG. 4(c)) of the thermoelectric conversion elements 11 via the first electrode portion 25, the second insulating layer 31 is disposed on the second end side (upper side in FIG. 4(c)) of the thermoelectric conversion elements 11 via the second electrode portion 35.

(Thermoelectric Conversion Element Bonding Step S04)

Next, the first insulating layer 21, the thermoelectric conversion element 11, and the second insulating layer 31 are pressurized and heated in the lamination direction, whereby the thermoelectric conversion element 11 and the first electrode portion 25 are bonded and the thermoelectric conversion element 11 and the second electrode portion 35 are bonded. In addition, in the present embodiment, the thermoelectric conversion element 11 and the first electrode portion 25, and the thermoelectric conversion element 11 and the second electrode portion 35 are bonded by solid phase diffusion bonding.

At least in the region of the first electrode portion 25 where the thermoelectric conversion element 11 is disposed, the thickness is 30 μm or more and the porosity P is less than 10%. Similarly, at least in the region of the second electrode portion 35 where the thermoelectric conversion element 11 is disposed, the thickness is 30 μm or more and the porosity P is less than 10%.

In this thermoelectric conversion element bonding step S04, the pressurization load is in a range of 20 MPa or more and 50 MPa or less, and the heating temperature is 300° C. or higher. In addition, in the present embodiment, the holding time at the heating temperature mentioned above is in a range of 5 minutes or longer and 60 minutes or shorter, and the atmosphere is a vacuum atmosphere.

Here, when the pressurization load in the thermoelectric conversion element bonding step S04 is less than 20 MPa, there is concern that the porosity of the first electrode portion 25 and the second electrode portion 35 may not be less than 10%. On the other hand, when the pressurization load in the thermoelectric conversion element bonding step S04 exceeds 50 MPa, there is concern that breaking may occur in the thermoelectric conversion element 11 or the first insulating layer 21 and the second insulating layer 31 made of alumina.

For this reason, in the present embodiment, the pressurization load in the thermoelectric conversion element bonding step S04 is set to be in a range of 20 MPa or more and 50 MPa or less.

In order to cause the porosity P of the first electrode portion 25 and the second electrode portion 35 to be reliably less than 10%, the lower limit of the pressurization load in the thermoelectric conversion element bonding step S04 is preferably 20 MPa or more, and more preferably 30 MPa or more. On the other hand, in order to reliably suppress the occurrence of breaking in the thermoelectric conversion element 11 or the first insulating layer 21 and the second insulating layer 31 made of alumina, the upper limit of the pressurization load in the thermoelectric conversion element bonding step S04 is preferably 50 MPa or less, and more preferably 40 MPa or less.

When the heating temperature in the thermoelectric conversion element bonding step S04 is lower than 300° C., there is concern that the thermoelectric conversion element 11 and the first electrode portion 25, and the thermoelectric conversion element 11 and the second electrode portion 35 may not be bonded.

Furthermore, the heating temperature in the thermoelectric conversion element bonding step S04 is preferably 500° C. or lower. When the heating temperature exceeds 500° C., there is concern that the thermoelectric conversion element 11 may be thermally decomposed and the characteristics thereof may be deteriorated.

In order to reliably bond the thermoelectric conversion elements 11 to the first electrode portion 25 and to the second electrode portion 35, the lower limit of the heating temperature in the thermoelectric conversion element bonding step S04 is preferably set to 350° C. or higher. On the other hand, in order to reliably suppress the thermal decomposition of the thermoelectric conversion elements 11, the upper limit of the heating temperature in the thermoelectric conversion element bonding step S04 is more preferably set to 400° C. or lower.

Figure 4:
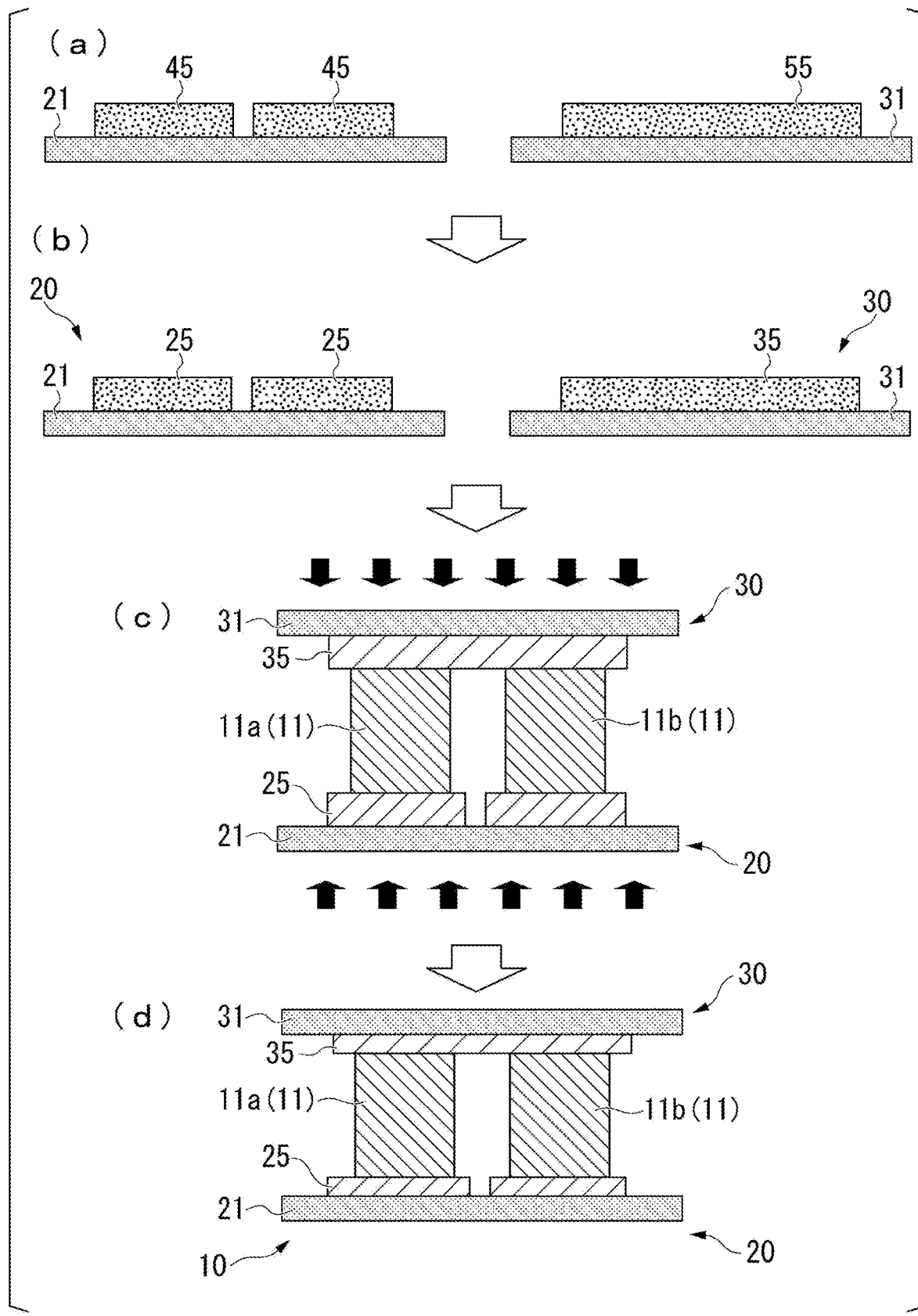
FIG. 4 is a schematic explanatory view of the method for producing a thermoelectric conversion module according to the embodiment of the present invention.

As described above, the thermoelectric conversion module 10 according to the present embodiment shown in FIG. 4(*d*) is produced.

In the thermoelectric conversion module 10 according to the present embodiment obtained as above, conversion between thermal energy and electrical energy is performed using the first heat transfer plate 20 side as a low temperature portion and the second heat transfer plate 30 side as a high temperature portion.

In the thermoelectric conversion module 10 according to the present embodiment configured as described above, the first heat transfer plate 20 (the first insulating circuit board) provided with the first insulating layer 21 of which at least one surface is made of alumina and the first electrode portion 25 formed of the sintered body of Ag formed on the one surface of the first insulating layer 21 is disposed on the first end side of the thermoelectric conversion elements 11, and the first electrode portion 25 has a thickness of 30 μm or more and a porosity P of less than 10% at least in the region where the thermoelectric conversion element 11 is disposed. Therefore, the first electrode portion 25 is formed dense and thick, and the electric resistance decreases. Moreover, since there are few pores, deterioration of the thermoelectric conversion element 11 due to the gas of the pores can be suppressed.

Furthermore, since the first electrode portion 25 is formed of the sintered body of the Ag paste (the glass-containing Ag paste 45), a bonding temperature (sintering temperature) can be under a relatively low temperature condition, for example, 400° C. or lower, and deterioration of the thermoelectric conversion element 11 at the time of bonding can be suppressed.

Furthermore, since no brazing material such as a silver braze is used at the time of bonding, no liquid phase is generated, and it is possible to suppress a variation in height that occurs when thermoelectric conversion elements with different thermal expansion coefficients for P-type and N-type are used, or the like.

In addition, since the first electrode portion 25 itself is made of Ag, the first electrode portion 25 can be stably operated even at an operating temperature of about 500° C. to 800° C.

Furthermore, since the surface of the first insulating layer 21 on which the first electrode portion 25 is formed is made of alumina, and the glass component is present at the interface between the first electrode portion 25 and the first insulating layer 21, the first electrode portion 25 and the first insulating layer 21 are firmly bonded to each other by the reaction between the glass component and alumina, and the bonding reliability is excellent.

Furthermore, in the present embodiment, in a case where the first electrode portion 25 has a structure in which the glass-containing region and the glass-free region are laminated and when the thickness of the glass-containing region in the lamination direction is referred to as Tg and the thickness of the glass-free region in the lamination direction is referred to as Ta, Ta/(Ta+Tg) is limited to 0.5 or less, it is possible to suppress the occurrence of delamination at the interface between the glass-containing region and the glass-free region.

In addition, when Ta/(Ta+Tg) exceeds 0, no glass component is present on the bonding surface to the thermoelectric conversion element 11, and it is possible to improve the bonding reliability between the thermoelectric conversion element 11 and the first electrode portion 25. Moreover, in this case, since no glass component is present on the surface of the first electrode portion 25, it is possible to improve the bonding reliability.

In addition, in the present embodiment, the second insulating circuit board is disposed on the second end side of the thermoelectric conversion elements 11, and the second electrode portion 35 of the second insulating circuit board also has a thickness of 30 μm or more and a porosity P of less than 10% at least in the region where the thermoelectric conversion element 11 is disposed. Therefore, the second electrode portion 35 is formed dense and thick, and the electric resistance is low. Moreover, since there are few pores, deterioration of the thermoelectric conversion element 11 due to the gas of the pores can be suppressed.

Furthermore, since the second electrode portion 35 is formed of the sintered body of the Ag paste (the glass-containing Ag paste 55), a bonding temperature (sintering temperature) can be under a relatively low temperature condition, for example, 400° C. or lower, and deterioration of the thermoelectric conversion element 11 at the time of bonding can be suppressed. In addition, since the second electrode portion 35 itself is made of Ag, the second electrode portion 35 can be stably operated even at an operating temperature of about 500° C. to 800° C.

Furthermore, since the surface of the second insulating layer 31 on which the second electrode portion 35 is formed is made of alumina, and the glass component is present at the interface between the second insulating layer 31 and the second electrode portion 35, the second electrode portion 35 and the second insulating layer 31 are firmly bonded to each other by the reaction between the glass component and alumina, and the bonding reliability is excellent.

Furthermore, in the present embodiment, in a case where the second electrode portion 35 has a structure in which the glass-containing region and the glass-free region are laminated and when the thickness of the glass-containing region in the lamination direction is referred to as Tg and the thickness of the glass-free region in the lamination direction is referred to as Ta, Ta/(Ta+Tg) is limited to 0.5 or less, it is possible to suppress the occurrence of delamination at the interface between the glass-containing region and the glass-free region.

In addition, when Ta/(Ta+Tg) exceeds 0, no glass component is present on the bonding surface to the thermoelectric conversion element 11, and it is possible to improve the bonding reliability between the thermoelectric conversion element 11 and the second electrode portion 35. Moreover, in this case, since no glass component is present on the surface of the second electrode portion 35, it is possible to improve the bonding reliability.

According to the method for producing the thermoelectric conversion module according to the present embodiment, in the thermoelectric conversion element bonding step S04, since the pressurization load is in a range of 20 MPa or more and 50 MPa or less and the heating temperature is 300° C. or higher, the thickness can be 30 μm or more and the porosity P can be less than 10% at least in the regions of the first electrode portion 25 and the second electrode portion 35 where the thermoelectric conversion element 11 is disposed. Moreover, since a relatively low temperature condition is applied, deterioration of the thermoelectric conversion element 11 at the time of bonding can be suppressed.

In addition, since the glass-containing Ag paste is applied to the one surfaces of the first insulating layer 21 and the second insulating layer 31 made of alumina and is sintered, the first insulating layer 21 and the first electrode portion 25 can be reliably bonded to each other and the second insulating layer 31 and the second electrode portion 35 can be reliably bonded to each other by the reaction between the glass component and alumina.

While the embodiment of the present invention has been described above, the present invention is not limited to this and can be appropriately modified without departing from the technical spirit of the invention.

For example, in the present embodiment, in the laminating step S03, it is described that the thermoelectric conversion element 11 is directly laminated on the first electrode portion 25 and the second electrode portion 35 and bonded by solid phase diffusion bonding. However, the bonding is not limited thereto. After a Ag bonding material is disposed on the first electrode portion 25 and the second electrode portion 35, the thermoelectric conversion element 11 may be disposed and bonded using the Ag bonding material.

Figure 5:
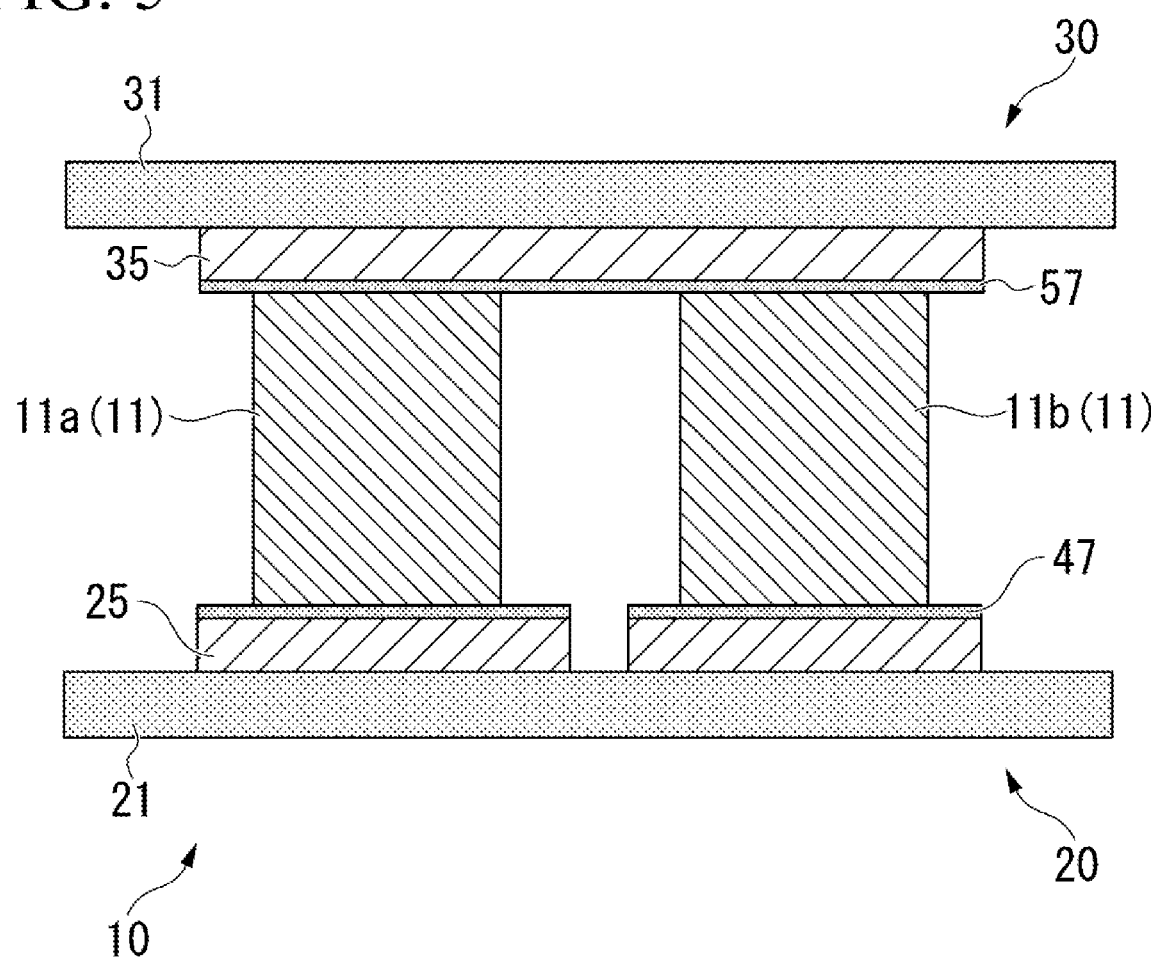
FIG. 5 is a schematic explanatory view of a thermoelectric conversion module according to another embodiment of the present invention.

In this case, as shown in FIG. 5, a first bonding layer 47 is formed between the first electrode portion 25 and the thermoelectric conversion element 11, and a second bonding layer 57 is formed between the second electrode portion 35 and the thermoelectric conversion element 11. In addition, in the thermoelectric conversion element bonding step S04, since the pressurizing and heating treatment is performed under the above-described conditions, the porosity of the first bonding layer 47 and the second bonding layer 57 becomes less than 10%.

Furthermore, in the present embodiment, it is described that the second insulating circuit board is disposed as the second heat transfer plate 30 on the second end side of the thermoelectric conversion elements 11. However, the configuration is not limited thereto. For example, a configuration in which the second electrode portion is disposed on the second end side of the thermoelectric conversion elements 11, an insulating substrate is laminated, and the insulating substrate is pressed in the lamination direction to form the second heat transfer plate may be adopted.

EXAMPLES

A confirmation experiment conducted to confirm the effectiveness of the present invention will be described.

Example 1

A thermoelectric conversion module was produced by the same method as in the above-described embodiment.

In Present Invention Examples 1 to 3 and Comparative Examples 1 to 5, as a thermoelectric conversion element, a 3 mm×3 mm×5 mmt half-Heusler element with a Ni base gold electrode was used, and 12 PN pairs were used. As an insulating layer, alumina having a thickness of 0.635 mm was used. As a glass-containing Ag paste for forming a first electrode portion, DD-1240D manufactured by Kyoto Elex Co., Ltd. was used. Heating conditions for forming the first electrode portion were temperature: 850° C. and holding time: 10 minutes. The thickness of the first electrode portion, and the heating temperature and pressurization load at the time of bonding the thermoelectric conversion element and the first electrode portion were as shown in Table 1. The bonding atmosphere was set as shown in Table 1, and regarding the bonding between the thermoelectric conversion element and first electrode portion and the bonding between the thermoelectric conversion element and second electrode portion, the thermoelectric conversion element and the first electrode portion, and the thermoelectric conversion element and the second electrode portion were directly laminated and bonded.

The second electrode portion had the same configuration as the first electrode portion.

(Presence or Absence of Glass Component)

After mechanically polishing a cross section of the first electrode portion of each obtained thermoelectric conversion module, Ar ion etching (Cross Section Polisher SM-09010 manufactured by JEOL Ltd.) was performed thereon, EPMA analysis was performed thereon, and a region where metal and oxygen coexist was determined as a glass component. The presence or absence of the glass component at the interface between the first electrode portion and the first insulating layer was checked. As a result, in all Present Invention Examples 1 to 3 and Comparative Examples 1 to 3, the glass component was confirmed at the interface.

(Electric Resistance)

In the atmosphere, the electric resistance (internal resistance) was measured (initial resistance) by setting the temperature of a heating iron plate in contact with the first heat transfer plate side of the produced thermoelectric conversion module to 550° C. and the temperature of a cooling iron plate in contact with the second heat transfer plate side to 50° C.

The temperature difference was continuously given to the thermoelectric conversion module, the rate of increase from the initial value of the internal resistance over time was calculated, and the durability of the thermoelectric conversion module after 24 hours was evaluated (internal resistance increase rate).

As the internal resistance, a variable resistor was installed between output terminals of the thermoelectric conversion module in a state where the temperature difference as described above was given, the current value and the voltage value were measured while changing the resistance, and a graph with the horizontal axis representing the current value and the vertical axis representing the voltage value was created. In this graph, the voltage value when the current value was 0 was taken as an open circuit voltage, and the current value when the voltage value was 0 was taken as a maximum current. In this graph, the open circuit voltage and the maximum current were connected by a straight line, and the slope of the straight line was taken as the internal resistance of the thermoelectric conversion module. The evaluation results are shown in Table 1.

(Porosity and Thickness of First Electrode Portion)

After mechanically polishing the cross section of the first electrode portion of each obtained thermoelectric conversion module, Ar ion etching (Cross Section Polisher SM-09010 manufactured by JEOL Ltd.) was performed thereon, and the cross section was observed using a laser microscope (VK X-200 manufactured by Keyence Corporation). The obtained image was binarized, white portions were determined as Ag, and black portions were determined as pores. From the binarized image, the area of the black portions was obtained, and the porosity was calculated by the following formula. Measurement was performed at five cross sections, and the porosities of the cross sections were arithmetically averaged to obtain the porosity of the first electrode portion. A case where the porosity was 10% or more was evaluated as "B", and a case where the porosity was less than 10% was evaluated as "A".

$$\text{Porosity } P = \text{area of black portions (pores)/observation area of the first electrode portion 25}$$

The thickness of the first electrode portion was measured using the laser microscope. The results are shown in Table 1.

TABLE 1

| | Thermoelectric conversion element bonding conditions | | | First electrode portion | | Electric resistance | |
|---|---|---|---|---|---|---|---|
| | | Pressurization | Heating | | | | Increase rate |
| | Atmosphere | load (MPa) | temperature (° C.) | Thickness (μm) | Porosity (%) | Initial (mΩ/pair) | after durability test (%) |
| Present Invention Example 1 | Vacuum | 50 | 500 | 70 | A | 24 | 0.3 |
| Present Invention Example 2 | Vacuum | 20 | 300 | 50 | A | 24 | 0.03 |
| Present Invention Example 3 | Vacuum | 20 | 300 | 30 | A | 27 | 0.03 |
| Comparative example 1 | Vacuum | 20 | 300 | 10 | A | 38 | — |
| Comparative example 2 | Vacuum | 20 | 275 | 50 | B | 26 | 2.5 |
| Comparative example 3 | Air atmosphere | 9 | 450 | 50 | B | 40 | — |
| Comparative example 4 | Vacuum | 50 | 250 | — | — | — | — |
| Comparative example 5 | Vacuum | 60 | 350 | — | — | — | — |

In Comparative Example 1 in which the thickness of the first electrode portion was 30 μm or less, the initial resistance was high. In Comparative Example 1, since the initial resistance was high, the internal resistance increase rate was not measured. In Comparative Example 2 in which the heating temperature was low, the porosity was 10% or more, and the internal resistance increase rate was high. In addition, in Comparative Example 3 in which the pressurization load was less than 20 MPa, the porosity was high and the initial resistance was high. In Comparative Example 3, since the initial resistance was high, the internal resistance increase rate was not measured. In Comparative Example 4 in which the bonding temperature was lower than that of Comparative Example 2, the thermoelectric conversion element could not be bonded. In Comparative Example 5 in which the bonding load exceeded 50 MPa, breaking had occurred in the first insulating layer. Therefore, in Comparative Examples 4 and 5, the thickness, porosity, and electric resistance of the first electrode portion were not evaluated.

On the other hand, in Present Invention Examples 1 to 3, it was found that the thermoelectric conversion module in which the first electrode portion had a thickness of 30 μm or more and a porosity of less than 10%, and the initial resistance and the internal resistance increase rate were also low could be obtained.

Example 2

Next, a thermoelectric conversion module was produced by the same method as in the above-described embodiment.

As a thermoelectric conversion element, a 3 mm×3 mm×5 mmt half-Heusler element with a Ni base gold electrode was used, and 12 PN pairs were used. As an insulating layer, alumina having a thickness of 0.635 mm was used.

Here, in a Ag paste applying step, as shown in Table 2, a glass-containing Ag paste (DD-1240D-01 manufactured by Kyoto Elex Co., Ltd.) and a Ag paste containing no glass component were applied. After applying the glass-containing paste, sintering was performed under the conditions of temperature: 850° C. and holding time: 10 minutes. Thereafter, the Ag paste containing no glass component was applied, and sintering was performed under the conditions of temperature: 850° C. and holding time: 10 minutes.

(Thickness Ratio of Glass-Free Region in First Electrode Portion, and Presence or Absence of Glass Component on Surface of First Electrode Portion)

After mechanically polishing a cross section of the first electrode portion of each obtained thermoelectric conversion module, Ar ion etching (Cross Section Polisher SM-09010 manufactured by JEOL Ltd.) was performed thereon, EPMA analysis was performed thereon, and a region where metal and oxygen coexist was determined as a glass component. The measurement was performed in a range of 50 μm at a magnification of 2000 times. The distance from the insulating layer to a glass particle present at the furthest position in the lamination direction was defined as the thickness Tg of the glass-containing region. Furthermore, the thickness of the first electrode portion was measured, and the value obtained by subtracting the thickness Tg of the glass-containing region from the thickness of the first electrode portion was defined as the thickness Ta of the glass-free region. Whether or not the glass component was present on the surface of the first electrode portion was observed.

(Presence or Absence of Delamination)

A laser microscope (VK X-200 manufactured by Keyence Corporation) was used for the cross section of the first electrode portion of each obtained thermoelectric conversion module, and a case where the glass-free region had delaminated from the glass-containing region by 10 μm or more in the end portion of the first electrode portion was evaluated as "present".

TABLE 2

|  | Glass-containing Ag paste Thickness (mm) | Ag paste Thickness (mm) | Thickness ratio* Ta/(Ta + Tg) | Presence or absence of delamination | Presence or absence of glass component on surface of first electrode portion |
|---|---|---|---|---|---|
| Present Invention Example 11 | 0.01 | 0.05 | 0.83 | Present | Absent |
| Present Invention Example 12 | 0.02 | 0.04 | 0.67 | Present | Absent |
| Present Invention Example 13 | 0.03 | 0.03 | 0.50 | Absent | Absent |
| Present Invention Example 14 | 0.04 | 0.02 | 0.33 | Absent | Absent |
| Present Invention Example 15 | 0.05 | 0.01 | 0.17 | Absent | Absent |
| Present Invention Example 16 | 0.06 | — | 0.00 | — | Present |

*The thickness of the glass-containing region is referred to as Tg, and the thickness of the glass-free region is referred to as Ta.

When the thickness of the glass-containing region in the lamination direction was referred to as Tg and the thickness of the glass-free region in the lamination direction was referred to as Ta, in a case where Ta/(Ta+Tg) was more than 0 and not more than 0.5, the occurrence of delamination at the boundary between the glass-containing region and the glass-free region could be suppressed.

REFERENCE SIGNS LIST 10 thermoelectric conversion module
11 thermoelectric conversion element
20 first heat transfer plate (first insulating circuit board)
21 first insulating layer
25 first electrode portion
30 second heat transfer plate (second insulating circuit board)
31 second insulating layer
35 second electrode portion

What is claimed is:

1. A thermoelectric conversion module comprising:
a plurality of thermoelectric conversion elements;
a first electrode portion disposed on a first end side of the thermoelectric conversion elements; and
a second electrode portion disposed on a second end side of the thermoelectric conversion elements,
wherein the plurality of thermoelectric conversion elements are directly connected to each other by the first electrode portion and/or the second electrode portion,
a second insulating circuit board provided with a second insulating layer of which at least one surface is made of alumina and the second electrode portion formed of a sintered body of Ag formed on the one surface of the second insulating layer is disposed on the second end side of the thermoelectric conversion elements,
adjacent thermoelectric conversion elements in the plurality of thermoelectric conversion elements are directly connected by the second electrode portion, the second electrode portion includes a glass-containing region and a glass-free region in this order from a second insulating layer side in a lamination direction, the glass-containing region is a region dispersing glass particles inside the sintered body of Ag, a glass component is present at an interface between the second electrode portion and the second insulating layer, and the second electrode portion has a thickness of 30 μm or more and a porosity of less than 10% at least in a region where the thermoelectric conversion element is disposed.

2. The thermoelectric conversion module according to claim 1, wherein, when a thickness of the glass-containing region in the lamination direction is referred to as Tg and a thickness of the glass-free region in the lamination direction is referred to as Ta, Ta/(Ta+Tg) is more than 0 and not more than 0.5.

3. The thermoelectric conversion module according to claim 1, wherein a first insulating circuit board provided with a first insulating layer of which at least one surface is made of alumina and the first electrode portion formed of a sintered body of Ag formed on the one surface of the first insulating layer is disposed on the first end side of the thermoelectric conversion elements, a glass component is present at an interface between the first electrode portion and the first insulating layer, and the first electrode portion has a thickness of 30 μm or more and a porosity of less than 10% at least in a region where the thermoelectric conversion element is disposed.

4. The thermoelectric conversion module according to claim 3, wherein the first electrode portion includes a glass-containing region and a glass-free region from the first insulating layer side in the lamination direction, and when a thickness of the glass-containing region in the lamination direction is referred to as Tg and a thickness of the glass-free region in the lamination direction is referred to as Ta, Ta/(Ta+Tg) is more than 0 and not more than 0.5.

5. The thermoelectric conversion module according to claim 1, wherein adjacent thermoelectric conversion elements in the plurality of thermoelectric conversion elements are directly connected by the first electrode portion, and the plurality of thermoelectric conversion elements are electrically connected in series by the first electrode portion and/or the second electrode portion.

6. The thermoelectric conversion module according to claim 3, wherein the first electrode portion includes a glass-containing region and a glass-free region in this order from a first insulating layer side in a lamination direction, the glass-containing region is a region dispersing glass particles inside the sintered body of Ag.

7. The thermoelectric conversion module according to claim 1, wherein metallized layers are respectively formed on a first end surface and a second end surface of the thermoelectric conversion element, and in the metallized layers, a bonding surface to the first electrode portion and a bonding surface to the second electrode portion are made of Au.

* * * * *